(12) United States Patent
Trimpl

(10) Patent No.: US 11,610,757 B2
(45) Date of Patent: Mar. 21, 2023

(54) SENSOR MODULE FOR SCANNING ELECTRON MICROSCOPY APPLICATIONS

(71) Applicant: KLA Corporation

(72) Inventor: Marcel Trimpl, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/000,231

(22) Filed: Aug. 21, 2020

(65) Prior Publication Data

US 2021/0066035 A1 Mar. 4, 2021

Related U.S. Application Data

(60) Provisional application No. 62/892,545, filed on Aug. 28, 2019.

(51) Int. Cl.
| | | |
|---|---|---|
| *H01J 37/244* | (2006.01) | |
| *H01J 37/28* | (2006.01) | |
| *H01J 37/26* | (2006.01) | |
| *H01J 37/317* | (2006.01) | |

(52) U.S. Cl.
CPC ............ *H01J 37/28* (2013.01); *H01J 37/244* (2013.01); *H01J 37/265* (2013.01); *H01J 37/3177* (2013.01); *H01J 2237/2448* (2013.01); *H01J 2237/24415* (2013.01); *H01J 2237/24475* (2013.01)

(58) Field of Classification Search
CPC ........ H10J 37/28; H10J 37/244; H10J 37/265; H10J 37/3177; H10J 2237/24415; H10J 2237/24475; H10J 2237/2448; H01J 37/28; H01J 37/244; H01J 37/265; H01J 37/3177; H01J 2237/24415; H01J 2237/24475; H01J 2237/2448
See application file for complete search history.

(56) References Cited

U.S. PATENT DOCUMENTS

| | | | |
|---|---|---|---|
| 6,586,733 B1 | 7/2003 | Veneklasen et al. | |
| 9,341,585 B2 * | 5/2016 | Barbi | .......... H01J 37/244 |
| 9,620,400 B2 * | 4/2017 | Jensen | .......... H01L 21/681 |
| 9,767,986 B2 | 9/2017 | Brown et al. | |
| 2004/0000642 A1 * | 1/2004 | Veneklasen | ............ H01J 37/26 |
| | | | 250/311 |

(Continued)

OTHER PUBLICATIONS

PCT International Search Report and Written Opinion for International Application No. PCT/US2020/047709 dated Dec. 2, 2020, 15 pages.

*Primary Examiner* — Wyatt A Stoffa

(74) *Attorney, Agent, or Firm* — Suiter Swantz pc llo

(57) ABSTRACT

A scanning electron microscopy (SEM) system is disclosed. The SEM system includes an electron source configured to generate an electron beam and a set of electron optics configured to scan the electron beam across the sample and focus electrons scattered by the sample onto one or more imaging planes. The SEM system includes a first detector module positioned at the one or more imaging planes, wherein the first detector module includes a multipixel solid-state sensor configured to convert scattered particles, such as electrons and/or x-rays, from the sample into a set of equivalent signal charges. The multipixel solid-state sensor is connected to two or more Application Specific Integrated Circuits (ASICs) configured to process the set of signal charges from one or more pixels of the sensor.

24 Claims, 18 Drawing Sheets

(56) References Cited

U.S. PATENT DOCUMENTS

| | | | |
|---|---|---|---|
| 2013/0032713 A1 | 2/2013 | Barbi et al. | |
| 2013/0119250 A1 | 5/2013 | Hosoya et al. | |
| 2014/0097341 A1* | 4/2014 | Tuma | H01J 37/244 |
| | | | 250/366 |
| 2016/0064184 A1* | 3/2016 | Brown | H01L 27/14661 |
| | | | 250/307 |
| 2017/0329025 A1* | 11/2017 | Brown | H01L 27/1464 |
| 2019/0378682 A1* | 12/2019 | Wang | H01J 37/285 |
| 2020/0013919 A1* | 1/2020 | Cao | H01L 31/186 |
| 2020/0227229 A1* | 7/2020 | Wang | H01J 37/244 |
| 2020/0335653 A1* | 10/2020 | Cao | G01N 23/046 |
| 2021/0013362 A1* | 1/2021 | Cao | H01L 31/02966 |
| 2022/0068590 A1* | 3/2022 | Luo | H01J 37/21 |

\* cited by examiner

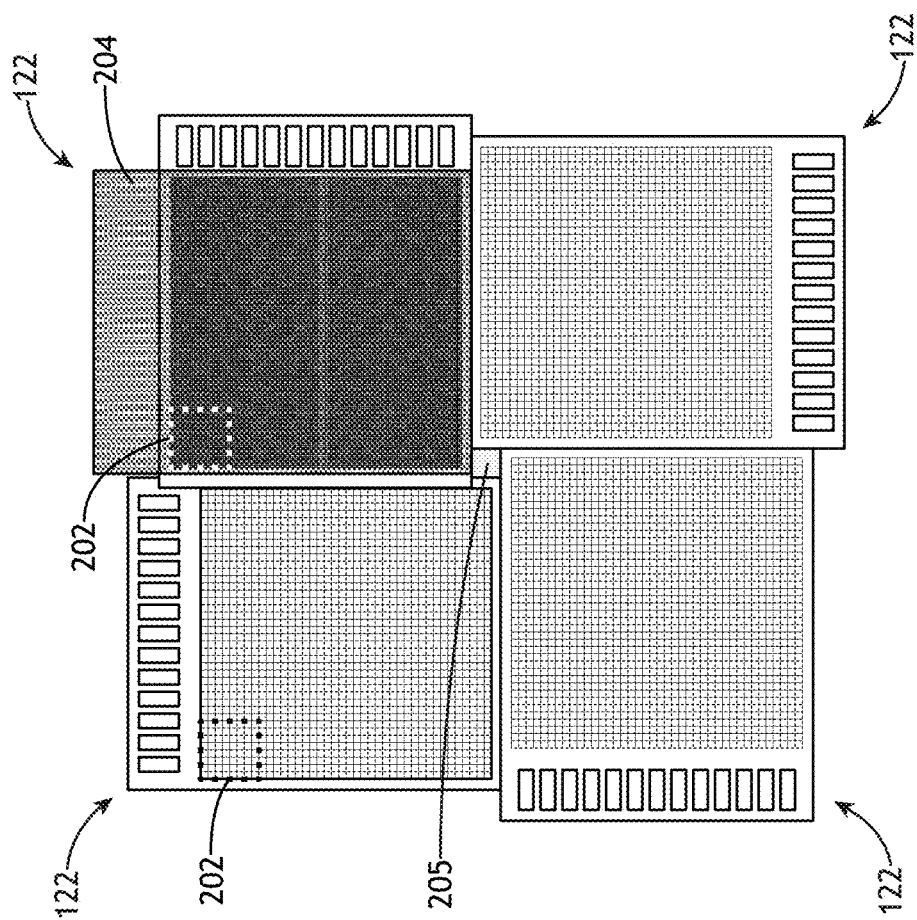

SENSOR MODULE FOR SCANNING ELECTRON MICROSCOPY APPLICATIONS

CROSS-REFERENCE TO RELATED APPLICATION

The present application claims priority to U.S. Provisional Patent Application No. 62/892,545, filed Aug. 28, 2019, naming Marcel Trimpl as inventor, which is incorporated herein by reference in the entirety.

TECHNICAL FIELD

The present invention generally relates to the fields of scanning electron microscopy and, more particularly, to a multipurpose sensor module for scanning electron microscopy applications, which provides for adaptive clustering and distributed digitization schemes.

BACKGROUND

Fabricating semiconductor devices such as logic and memory devices typically includes processing a substrate such as a semiconductor wafer using a large number of semiconductor fabrication processes to form various features and multiple levels of the semiconductor devices. As semiconductor device size become smaller and smaller, it becomes critical to develop enhanced semiconductor device and photomask inspection and review devices. Scanning electron microscopy (SEM) systems are one such technology used to inspect and review samples. SEM systems incorporate particle detectors used to detect secondary electrons, backscattered electrons, and x-rays, which are scattered from or emitted by the sample in response to a primary electron beam scanned across the sample. In an effort to improve the efficiency and accuracy of SEM systems, it is desirable to provide improved particle (e.g., electron and x-ray) sensor devices and methods.

SUMMARY

A scanning electron microscopy system is disclosed. In one illustrative embodiment, the system includes an electron source configured to generate an electron beam. In another illustrative embodiment, the system includes a set of electron optics configured to scan the electron beam across the sample and focus electrons scattered by the sample onto one or more imaging planes. In another illustrative embodiment, the system includes a first detector module positioned at the one or more imaging planes. In another illustrative embodiment, the first detector module includes a multipixel solid-state sensor configured to convert scattered particles from the sample into a set of equivalent signal charges. In another illustrative embodiment, the multipixel solid-state sensor is connected to two or more Application Specific Integrated Circuits (ASICs) configured to process the set of signal charges from one or more pixels of the sensor.

An additional and/or alternative scanning electron microscopy system is disclosed. In one illustrative embodiment, the system includes an electron source configured to generate an electron beam. In another illustrative embodiment, the system includes a set of electron optics configured to scan the electron beam across the sample and focus electrons scattered by the sample onto one or more imaging planes. In another illustrative embodiment, the system includes a first detector module positioned at the one or more imaging planes. In another illustrative embodiment, the first detector module includes a multipixel Application Specific Integrated Circuit (ASIC). In another illustrative embodiment, each pixel of the multipixel ASIC comprises a photodiode configured to convert particles scattered by the sample into equivalent electrical signals, and each pixel of the multipixel ASIC includes circuitry to process the equivalent electrical signals.

A method of inspecting a sample is disclosed. In one illustrative embodiment, the method includes generating a scan clock signal. In another illustrative embodiment, the method includes generating a first electron beam. In another illustrative embodiment, the method includes deflecting the first electron beam synchronous with the scan clock signal to scan an area on the sample. In another illustrative embodiment, the method includes directing a signal generated by the sample in response to the electron beam to a cluster comprising two or more pixels. In another illustrative embodiment, the method includes detecting charge collected by the cluster in a first time interval, wherein the first time interval is synchronized to the scan clock to generate a first electrical signal corresponding to the charge collected by the cluster in the first time interval and converting the first electrical signal into a first digital signal. In another illustrative embodiment, the method includes detecting the charge collected by the cluster in a second time interval, wherein the second time interval is synchronized to the scan clock to generate a second electrical signal corresponding to the charge collected in the second time interval and converting the second electrical signal into a second digital signal, wherein converting the second electrical signal starts before converting the first electrical signal is completed. In another illustrative embodiment, the method includes determining the presence of a defect by analyzing the first digital signal and the second digital signal.

An additional and/or alternative method of inspecting a sample is disclosed. In one illustrative embodiment, the method includes generating a scan clock signal. In another illustrative embodiment, the method includes generating a first electron beam. In another illustrative embodiment, the method includes deflecting the first electron beam to a first location on the sample. In another illustrative embodiment, the method includes directing a signal generated by the sample in response to the first electron beam to a pixel. In another illustrative embodiment, the method includes detecting the charge collected by the pixel to generate an electrical signal corresponding to the charge collected by the pixel. In another illustrative embodiment, the method includes comparing the electrical signal with a first threshold and a second threshold and determining the presence of an element if the electrical signal is greater than the first threshold and the electrical signal is smaller than the second threshold.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

FIG. 2B illustrates a multipixel detector module configured as a backscattered electron and/or x-ray detector, in accordance with one or more embodiments of the present disclosure.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed toward a multipurpose sensor module and methods suitable for scanning electron microscopy applications with adaptive clustering and a distributed digitization scheme.

Figure 1:
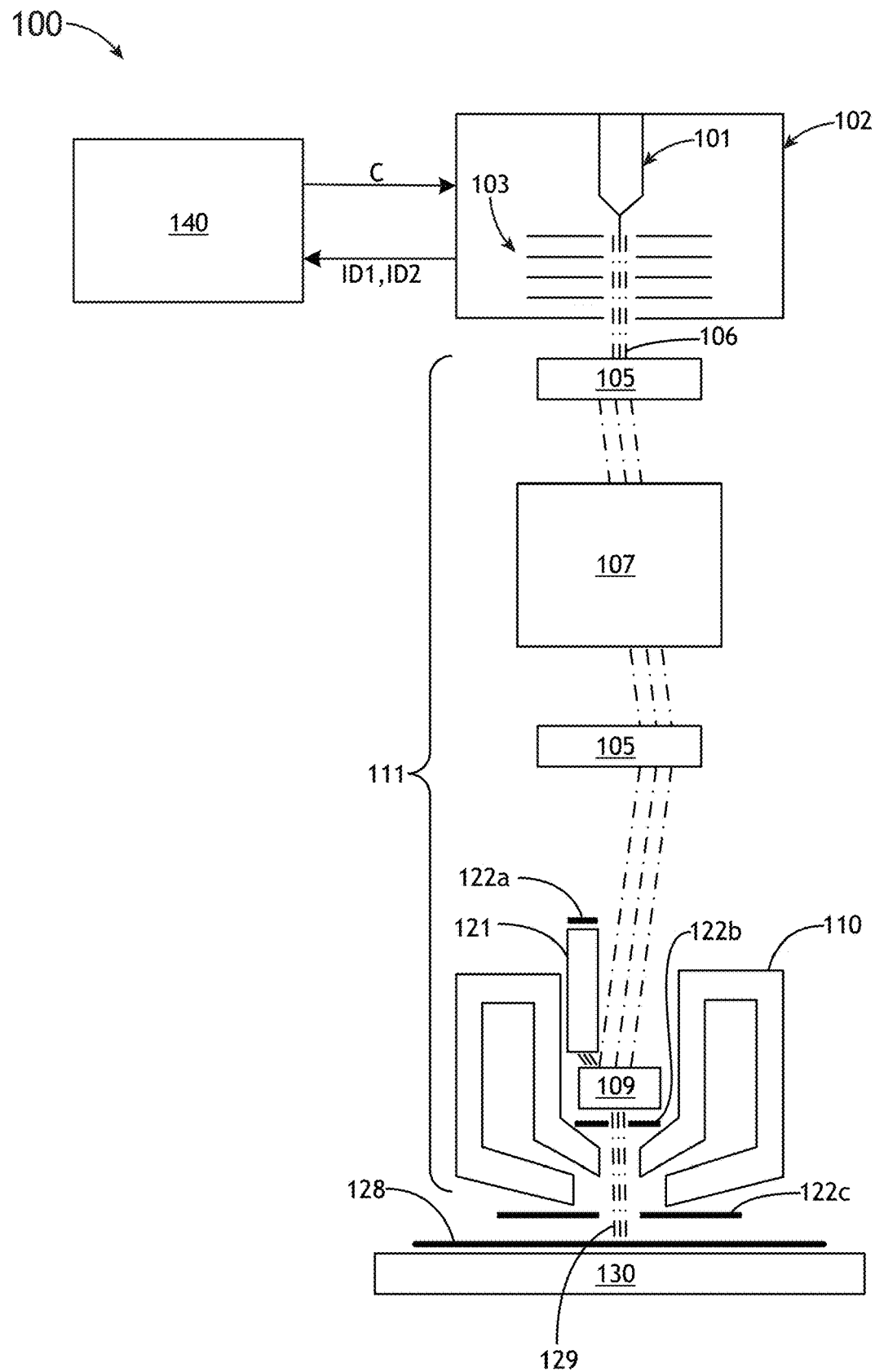
FIG. 1 illustrates a scanning electron microscopy system, in accordance with one or more embodiments of the present disclosure.

FIG. 1 illustrates a conceptual view of a scanning electron microscopy (SEM) system 100, in accordance with one or more embodiments of the present disclosure. The SEM system 100 may be configured as an inspection and/or a review tool. In this regard, the SEM system 100 may be used to review and/or inspect a sample 128 for defects and to reveal the material composition of the sample 128 and/or defects. Alternatively, the SEM system 100 may be configured as an imaging-based overlay metrology tool. In this regard, the SEM system 100 may be used to acquire images of overlay metrology targets disposed on the sample 128, which may then be used to determine overlay error between successive layers of the sample 128.

In embodiments, the SEM system 100 includes an electron source 102. The electron source 102 may include any electron source suitable for generating one or more electron beams 106. The electron source 102 may include one or more electron emitters 101. For example, the one or more electron emitters 101 may include a single electron emitter. By way of another example, the one or more electron emitters 101 may include multiple electron emitters. The one or more electron emitters 101 may include any electron emitter known in the art of electron emission. The electron source 102 may include one or more extractors 103.

In embodiments, the SEM system 100 includes an electron optical system 111 including a set of electron optics arranged in an electron-optical column. The electron optical system 111 may include one or more focusing optics for focusing the electron beam 106 onto the sample 128. The electron optical system 111 may include one or more deflection optics configured to scan the beam 106 across the sample 128. The electron optical system 111 may include any focusing and deflection optics known in the art of scanning electron microscopy. For example, the one or more focusing optics may include, but are not limited to, one or more condenser lenses 107 and one or more objective lenses 110. The one or more deflection optics may include, but are not limited to, one or more deflectors (e.g., scanning coils). For example, the electron-optical system 111 may include one or more deflectors 105 and one or more lower deflectors 109. During operation, the electron source 102 generates an electron beam 106. The electron beam 106 may be focused and deflected by multiple focusing and deflection optics 105, 107, 109, 110 of the electron optical system 111 onto sample 128 positioned on a moving stage 130. In embodiments, the electron source 102 may generate multiple beams that are deflected and focused onto the sample 128. It is noted that the electron source 102 and electron-optical column 111 may be arranged in a single-beam configuration or in a multi-beam configuration including multiple sources/columns.

In embodiments, the system 100 includes one or more detector modules positioned at one or more selected locations within the electron optical system 111. The one or more detector modules each include one or more multipixel solid-state sensors. For example, the detector modules 122a, 122b, and/or 122c may each include one or more solid-state sensors. For instance, a first multipixel detector module 122a may be placed away from the sample 128 to collect secondary electrons 129 that are scattered from the sample and collected and accelerated by the electrodes 121 onto the detector plane of one or more multipixel solid-state sensors of the detector module 122a. In another instance, the detector modules 122b and/or 122c may be placed proximate to the sample 128 to collect particles, such as, but not limited to, backscattered electrons, x-rays, and/or auger electrons emanating from the sample 128 (e.g., particles emanating from the sample at very high solid angle). As shown in FIG. 1, one or more of the detector modules 122a-122c may be positioned within the electron-optical column. It is noted that the scope of the present disclosure is not limited to the position or number of detector modules depicted in FIG. 1 and that any number of multipixel detector modules and any number of positions may be implemented within system 100.

In embodiments, one or more multipixel solid-state sensors of the detector modules 122a, 122b, and/or 122c are connected to two or more logic elements. For example, one or more of the multipixel solid-state sensors may be connected to two or more Application Specific Integrated Circuits (ASICs). In embodiments, the two or more logic elements are configured to process the set of signal charges from the pixels from a given multipixel solid-state sensor. While it is noted that the one or more detector modules may utilize any suitable logic element known in the art to process signal charges from pixels, for the purposes of simplicity the detector modules are described in the context of ASICs. Such a configuration should not be interpreted as a limitation on the scope of the present disclosure.

Figure 2A:
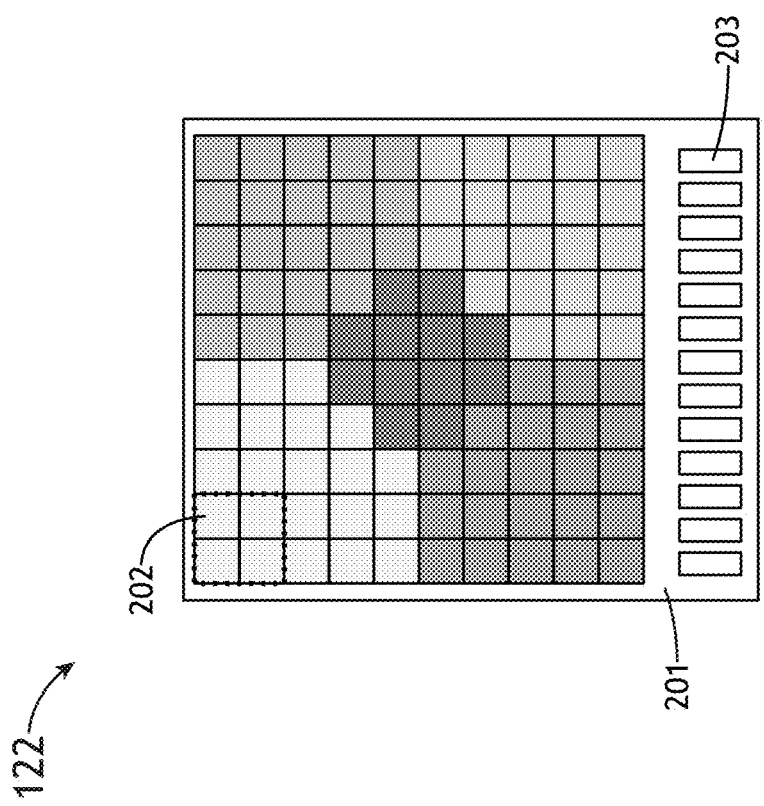
FIG. 2A illustrates a multipixel detector module configured as a secondary electron detector, in accordance with one or more embodiments of the present disclosure.
Figure 2C:
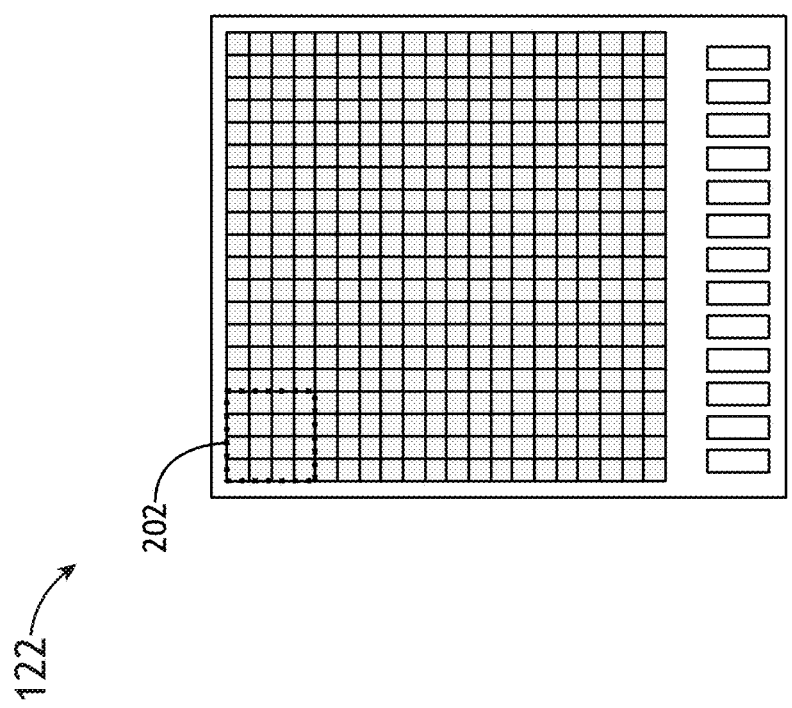
FIG. 2C illustrates a multipixel detector module arranged in a multi-electron beam configuration, in accordance with one or more embodiments of the present disclosure.

FIGS. 2A-2C illustrate different configurations of the multipixel detector module 122 suitable for use in the SEM system 100, in accordance with one or more embodiments of the present disclosure. FIG. 2A illustrates a multipixel detector module 122 configuration suitable for use as a secondary electron detector. FIG. 2B illustrates a multipixel detector module 122 configuration suitable for use as a backscattered electron and/or x-ray detector. FIG. 2C illustrates a multipixel detector module 122 configuration for a multi-electron beam system, where deflected signals from all electron beams are detected simultaneously by the multipixel detector module.

In embodiments, as shown in FIG. 2A, a multipixel detector module 122 includes a substrate carrier 201. For example, the substrate carrier 201 may include a ceramic material on which a multipixel solid state sensor readout by ASICs are mounted. The substrate carrier 201 includes a set of electrical contacts 203 for steering and control voltages and provides for a data pathway, allowing data to be collected by the module. The area 202 represents an area that is covered by one ASIC. For example, as shown in FIG. 2B, the area 202 represents an area that is covered by one ASIC with a size of 4 mm×4 mm that may contain 16×16 pixel readout channels. It is noted that the scope of the present disclosure is not limited by the number, size, or position of the ASIC clustering of pixels as shown in FIG. 2A. Rather, it is noted that for the different use cases, different ASIC clustering configurations may be implemented. The cluster size and the resulting cluster conversion rate is illustrated in Table I.

TABLE I

Cluster Conversion Rate for Various Cluster Sizes.

| Cluster Size (pixel * pixel) | Cluster Size (mm) | Cluster Conversion Rate (MHz) | Clusters per ASIC |
| --- | --- | --- | --- |
| 4 × 4 | 1 | 48 | 16 |
| 8 × 8 | 2 | 192 | 4 |
| 1 × 1 | 0.25 | 3 | 256 |

The example uses a 250 µm sensor pixel, and a total of 16×16 sensor pixels read out per ASIC and a data converter with a conversion rate of 3 MHz that is incorporated in each readout pixel.

In the example of FIG. 2A, a cluster size of 8×8 pixels is configured and a total of 4 clusters per ASIC are generated. Such a configuration may be particularly useful in the case of a secondary electron detector. The conversion rate per cluster in this configuration is approximately 200 MHz. Furthermore, clusters generated by the ASICs may further be processed in the downstream data path to generate one or more subchannels of the detector. It is noted that FIG. 2B illustrates a case where 5 channels are generated by the module.

In embodiments, as shown in FIG. 2B, multiple detector modules 122 may be implemented. In the example depicted in FIG. 2B, multiple detector modules 122 (e.g., 2, 3, 4, 5, 6, N detector modules) are arranged around the primary beam 106 to form a passing aperture 205 proximate to the sample plane (e.g., wafer plane) to collect backscattered electrons and/or other particles, such as x-rays or auger electrons at high solid angle. In embodiments, each detector module 122 may be configured differently depending on the purpose of the detection. In one application shown in FIG. 2B, three detector modules are configured with a cluster size of 2×2, while one detector module 122 (upper right) is configured to detect x-rays emitted by the sample. It is noted that the arrangement, number, and cluster size are not limited to the previous description. Rather, it is noted that the set of detector modules 122 shown in FIG. 2B may include any number of detector modules 122 arranged in any pattern to form an aperture 205 and the detector modules 122 may have any cluster size. It is noted that a cluster size of 4×4 may be used, which yield a cluster conversion rate of close to 50 MHz. For x-ray detection, a detector module 122 may be configured to readout each pixel individually (e.g., cluster of 1×1) at a slow conversion rate, such as, but not limited to, 3 MHz.

In embodiments, one or more of the detector modules 122 may include a screen 204. The screen 204 may be inserted on top of one or more detector modules 122. The screen 204 may be formed of a thin material with low atomic number. For example, the screen 204 may be comprised of, but is not limited to, a 50-150 µm thin beryllium screen. For instance, the screen may be a 100 µm beryllium screen. By way of another example, the screen 204 may be comprised of layer of material formed directly onto the sensor module 122. For instance, the screen 204 may include, but is not limited to, a boron or carbon or aluminum layer deposited directly onto the sensor module 122. During operation, the screen 204 absorbs electrons scattered by the sample 128 during the scan and allows most of the x-rays generated by the sample 128 during the scan pass, providing a more efficient detection. The screen 204 may be added to one or more of the detector modules 122 and may be permanently installed or maybe be inserted and retractable to change the configuration of the detector modules 122. It is noted that the utilization of the screen 204 is not limited to the configuration depicted in FIG. 2B and one or more screens 204 may be utilized with any number of detection modules 122 and within any arrangement.

In embodiments, as shown in FIG. 2C, the ASICs of the detector module 122 are configured with a cluster size of 4×4. It is noted that, if such a detector module 122 were implemented in a multibeam configuration of the SEM system 100, a total of 400 scattered beams at a rate close to 50 MHz would be detected with such a module.

Figures 3A, 3B:
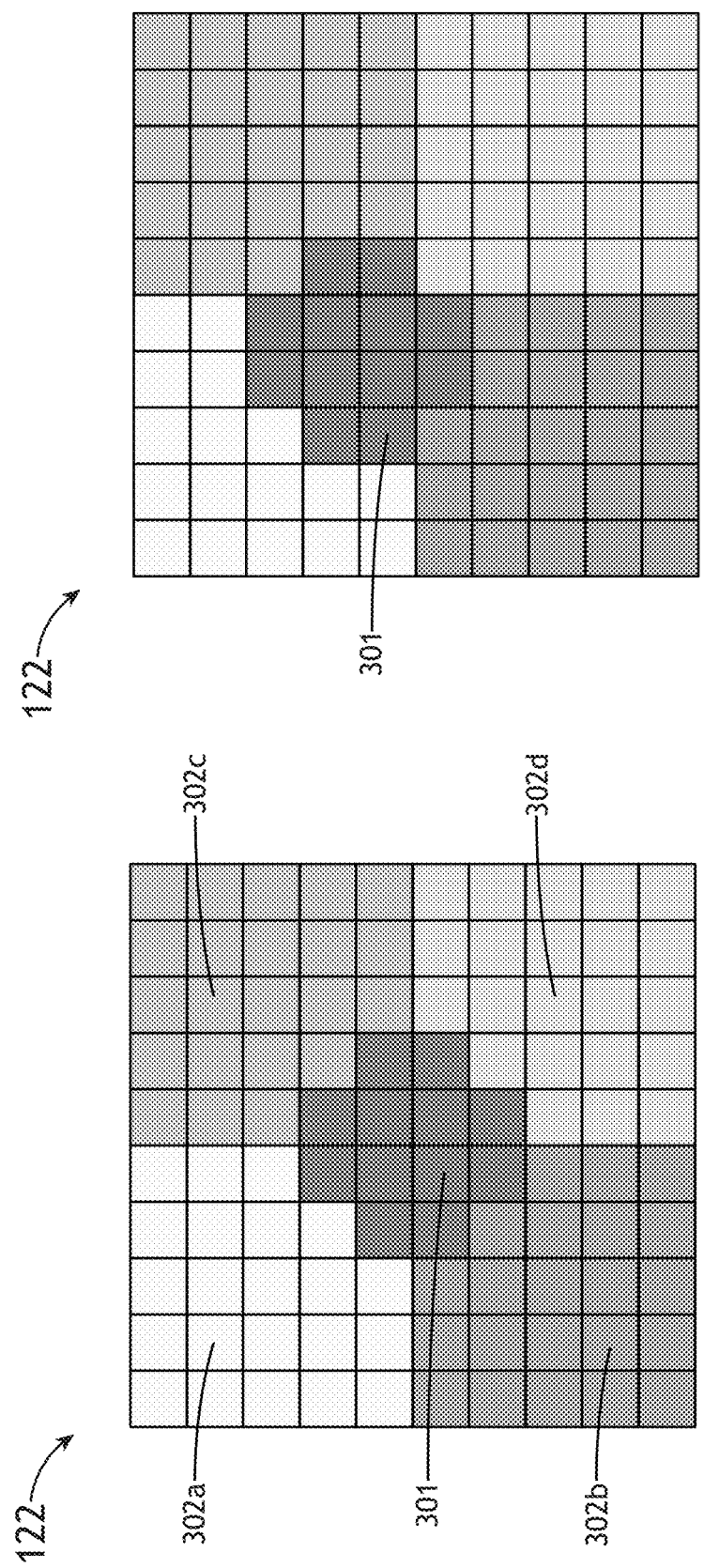
FIGS. 3A-3D illustrate the combining of clusters delivered by ASICs to a select number of channels, in accordance with one or more embodiments of the present disclosure.
Figure 3D:
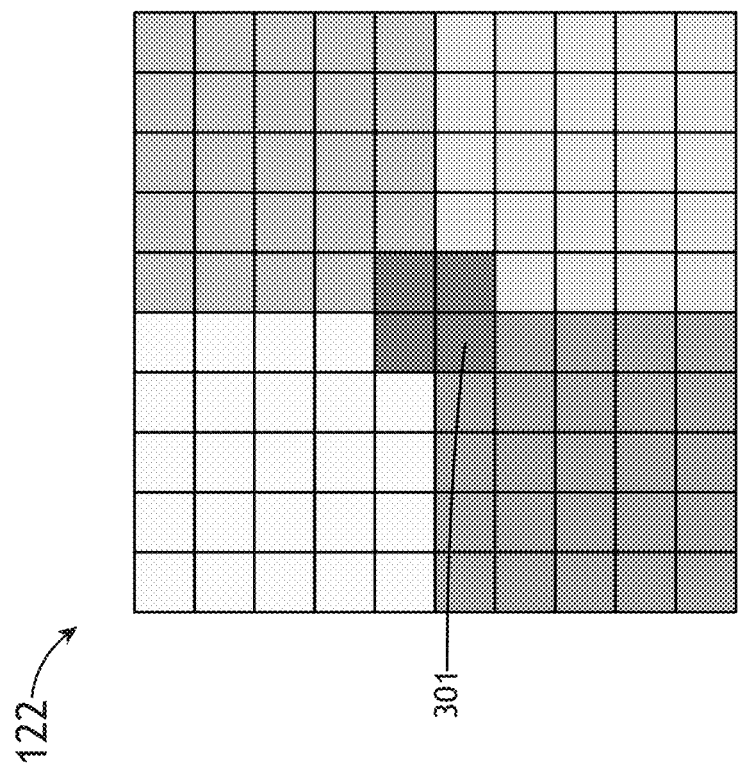

FIGS. 3A-3D illustrate the combining of clusters delivered by ASICs to a select number of channels, in accordance with one or more embodiments of the present disclosure. It is noted that the formation of the multiple channels, as shown in FIGS. 3A-3D, may be adjusted for different use cases of the SEM system 100. For example, as shown in FIG. 3A, a configuration with one center channel 301 and 4 side channels 302a, 302b, 302c, 302d is illustrated. The combination of clusters may be performed dynamically during a scan, whereby the shape and the size of the channels may be changed within the detector module 122. Such a feature may accommodate changes in the scattered beam 129 during a scan such as changes in focus/defocus of the primary beam 106 or wandering of the scattered beam 129. For example, the cluster configuration of FIG. 3B may be implemented to accommodate situations where the scattered electron beam 129 wanders or drifts, moving from a center location of the detector module 122 to a non-centered location.

Figure 3C:
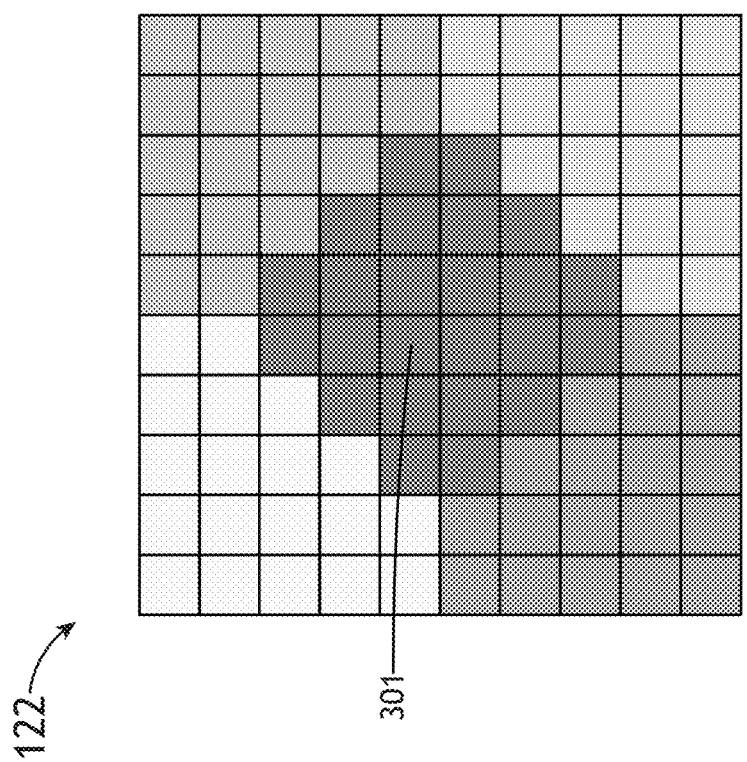

By way of another example, the cluster configuration of FIG. 3C may be implemented to accommodate situations where a larger center channel 301 is needed. By way of another example, the cluster configuration of FIG. 3D may be implemented to accommodate situations where a smaller center channel 301 is needed. By way of another example, multiple separate clusters may be combined into a single center channel 301.

Figure 4A:
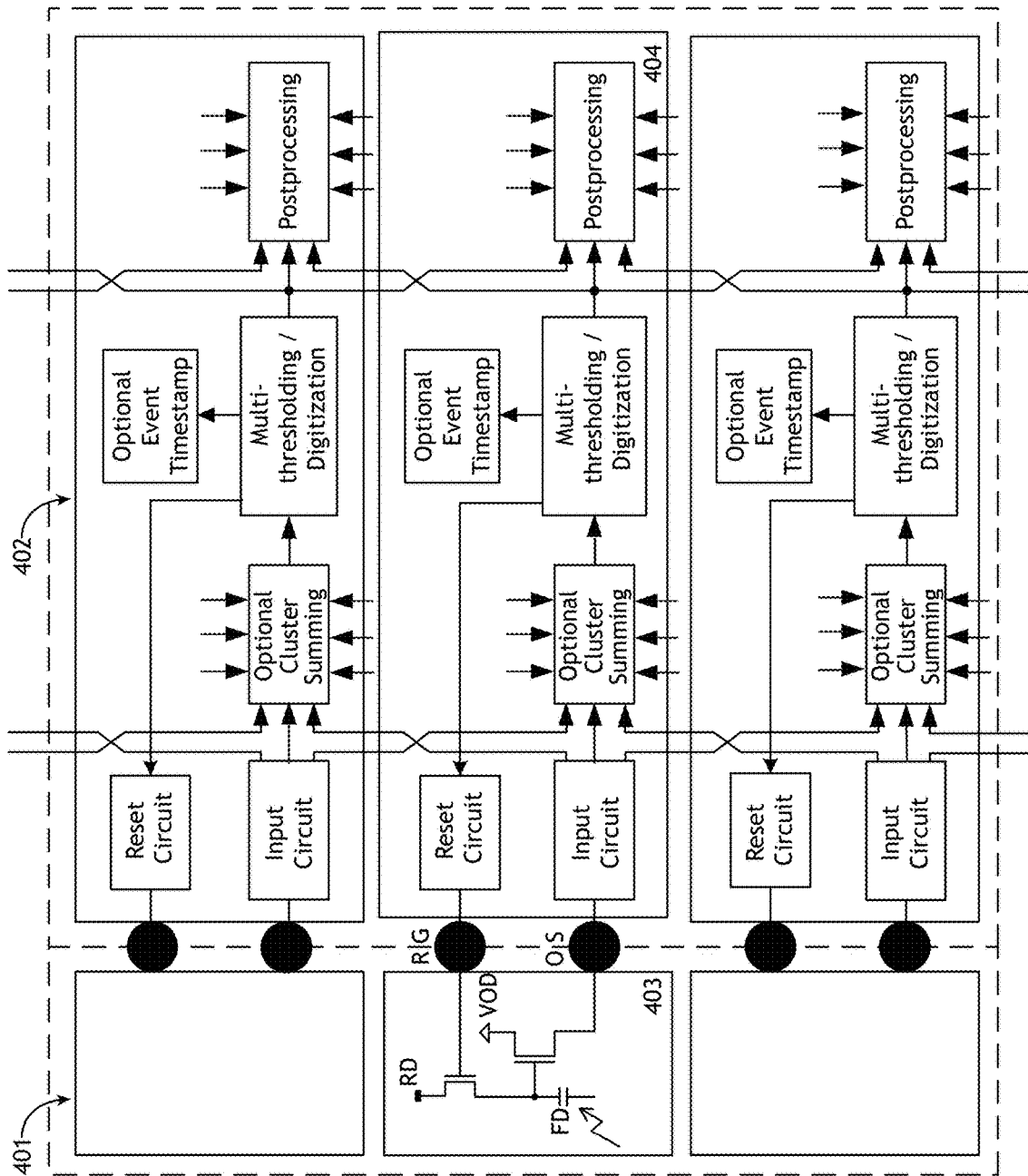
FIG. 4A illustrates a block diagram view of a connection between a sensor and the ASIC and the operation within one readout channel, in accordance with one or more embodiments of the present disclosure

FIG. 4A illustrates a block diagram view of a connection between a sensor and the ASIC and the operation within one readout channel, in accordance with one or more embodiments of the present disclosure.

In embodiments, a sensor 401 is attached to one or more ASICs 402 with at least one connection per pixel. In one configuration, the sensor pixel 403 may be composed of a floating diffusion node (FD), such as a floating diffusion capacitor, that collects the charge that is generated within the pixel in a volume that is connected to the gate of an amplifier stage. In this example, the amplifier stage may be biased by a common voltage VOD (Voltage Drain). The output of the amplifier stage (OS) may be connected to an individual readout pixel 404 of the ASIC 402 for further processing. In embodiments, the amplifier in the sensor pixel 403 may be connected such that the source potential is biased at a constant voltage and that the signal is read out at the drain.

In embodiments, the voltage of the floating diffusion node is controlled by a reset stage. In this configuration, the reset stage may include a simple reset transistor, whereby the drain of the transistor is connected to a global reset voltage (RD). The reset stage may be controlled via the Reset Gate (RG).

In embodiments, the Reset Gate may provide a global signal that is common to all pixels of the sensor array.

In embodiments, an additional contact per pixel may be provided between the Reset Gate of the pixel of the sensor layer and a reset circuit unit within each pixel of the ASIC.

The top sensor tier 401 of the assembly may be a sensor layer utilizing resistive gate and floating diffusion technology as described in U.S. Pat. No. 9,767,986, issued on Sep. 19, 2017, entitled "Scanning electron microscope and methods of inspecting and reviewing samples" to Brown et al., which is incorporated herein by reference in the entirety.

In embodiments, instead of the use of a sensor layer 401 that is attached to the readout pixel 404, a photodiode may be implemented in each pixel of the ASIC 402 to detect the particles deflected from the sample 128 during a scan. The photodiode may be implemented by the use of deep implants of a high voltage (HV) process with more than 10V supply rail. FIG. 4C depicts a photodiode 410 implemented within an ASIC 402.

In embodiments, the readout pixel 404 of the readout ASIC 402 receives the signal from the sensor pixel 403 with an input stage. The parasitic impedance between the amplifier output and the input stage may be kept to a minimum to achieve maximal speed for processing at a given power consumption. The input stage is connected by a cluster summing circuit that sums the signals from this pixel and neighboring pixels to a cluster. FIG. 4A shows the connection from the central pixel with the two direct neighbors, additional inputs from other pixels in the vicinity are indicated. Practical sizes for the cluster should be in the range of 1-10 pixel, where a cluster of 1 represents the summing being disabled and each pixel being processed individually (e.g., see examples given in Table 1). The cluster signal may then be further processed by digitization and additional processing. The digitization step may include a standard analog-to-digital conversion with equidistant quantization steps or a multi-threshold chemical elemental search as further described in FIG. 7. For the applications involving detecting separate events, a timestamp unit may be implemented to record the arrival of each event with the scan clock and assign the event to the scan location on the sample 128. It is noted that part of the postprocessing involves the data stream handling necessary to evacuate the data from each pixel off each ASIC 402. Summing of the pixel values may be performed in the postprocessing unit after digitization.

In embodiments, a reset circuit may be triggered by the digitization unit to control the voltage of the reset gate of the sensor pixel. The reset circuit may use high voltage process components to provide an adequate voltage for the reset stage to function (e.g., 10-30V). The control of the reset gate may be in form of a reset pulse to reset the floating diffusion. A pixelwise reset can extend the dynamic range of the sensor pixel indefinitely and accommodate for particle flux variations between pixels within the sensor. Such a reset pulse may be synchronized for all pixels of the sensor to mimic the functionality of a global reset. The utilization of a pixelwise reset may enable a very fast reset at low power as a much smaller capacitance is driven compared to a global reset that is routed throughout the whole sensor array. The reset circuit may also provide an analog voltage to form a closed feedback loop control to the floating diffusion to enhance immunity to pixel to pixel transistor variations and thermal drifts.

Figure 4B:
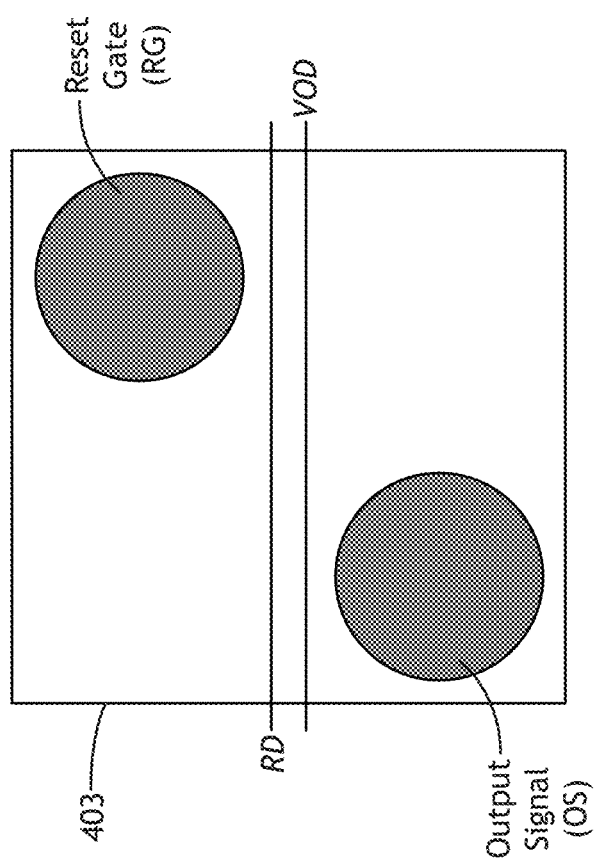
FIG. 4B illustrates conceptual view of a coarse floorplan of a sensor pixel, in accordance with one or more embodiments of the present disclosure.
Figure 4C:
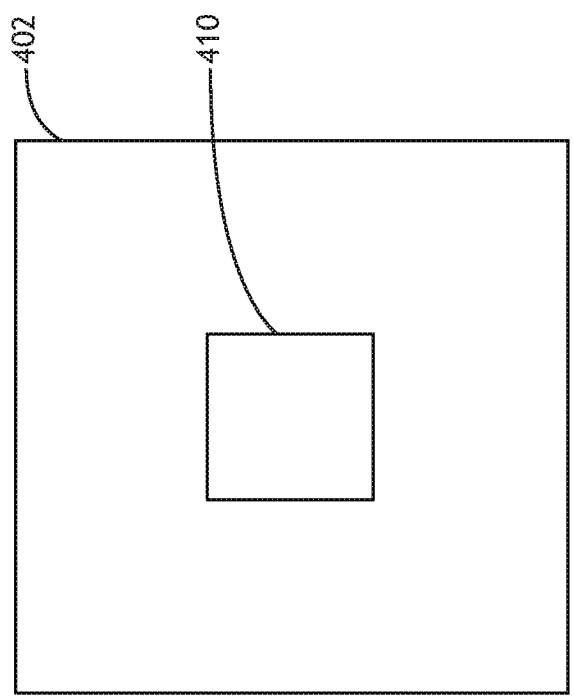
FIG. 4C illustrates an ASIC comprising a photodiode, in accordance with one or more embodiments of the present disclosure.

FIG. 4B illustrates conceptual view of a coarse floorplan of a sensor pixel 403, in accordance with one or more embodiments of the present disclosure. FIG. 4B depicts the course floorplan of the sensor pixel 403 with the reset gate (RG) and output signal (OS) connection to the readout ASIC and the other bias points, reset drain (RD) and voltage drain (VOD) of the sensor pixel 403 being routed as global signals for the entire sensor array. In embodiments, where the reset gate (RG) is not provided for each pixel from the ASIC 402, the reset gate (RG) may be routed row-wise or globally on the sensor similar to the reset drain and voltage drain signals.

Figure 5A:
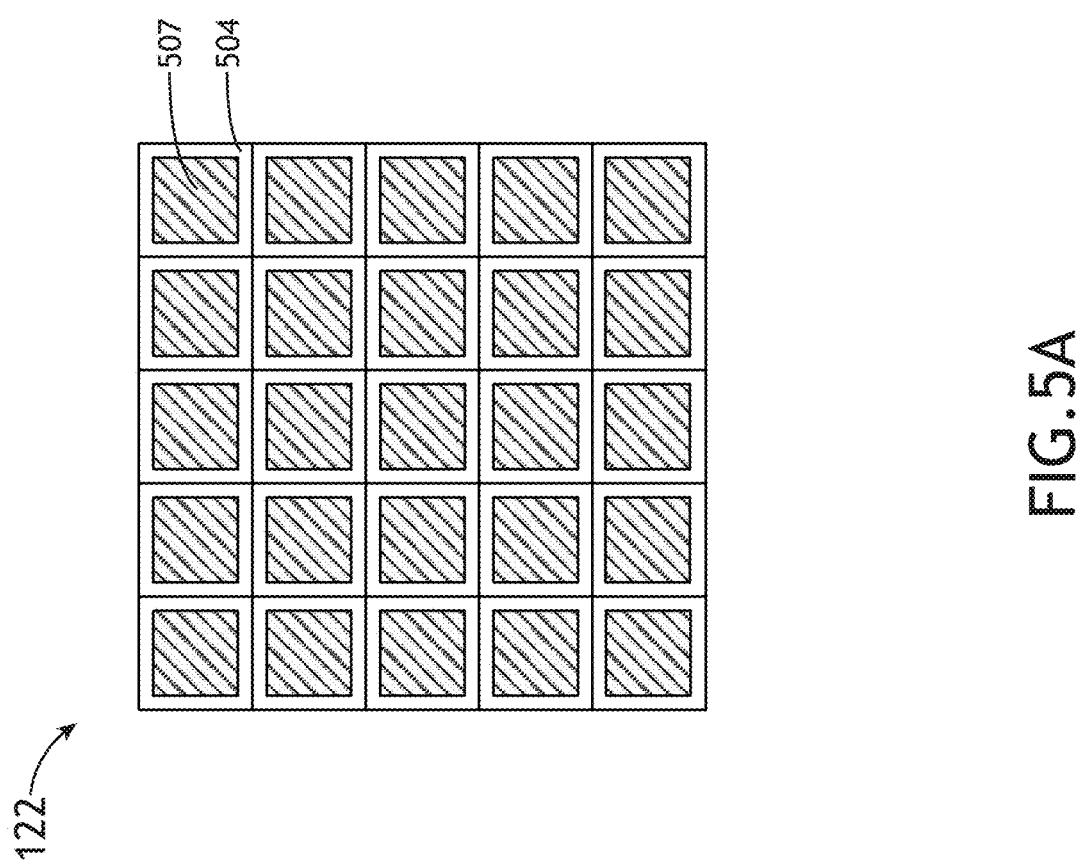
FIGS. 5A-5B illustrate the physical assembly of the detector module respectively, in accordance with one or more embodiments of the present disclosure.
Figure 5B:
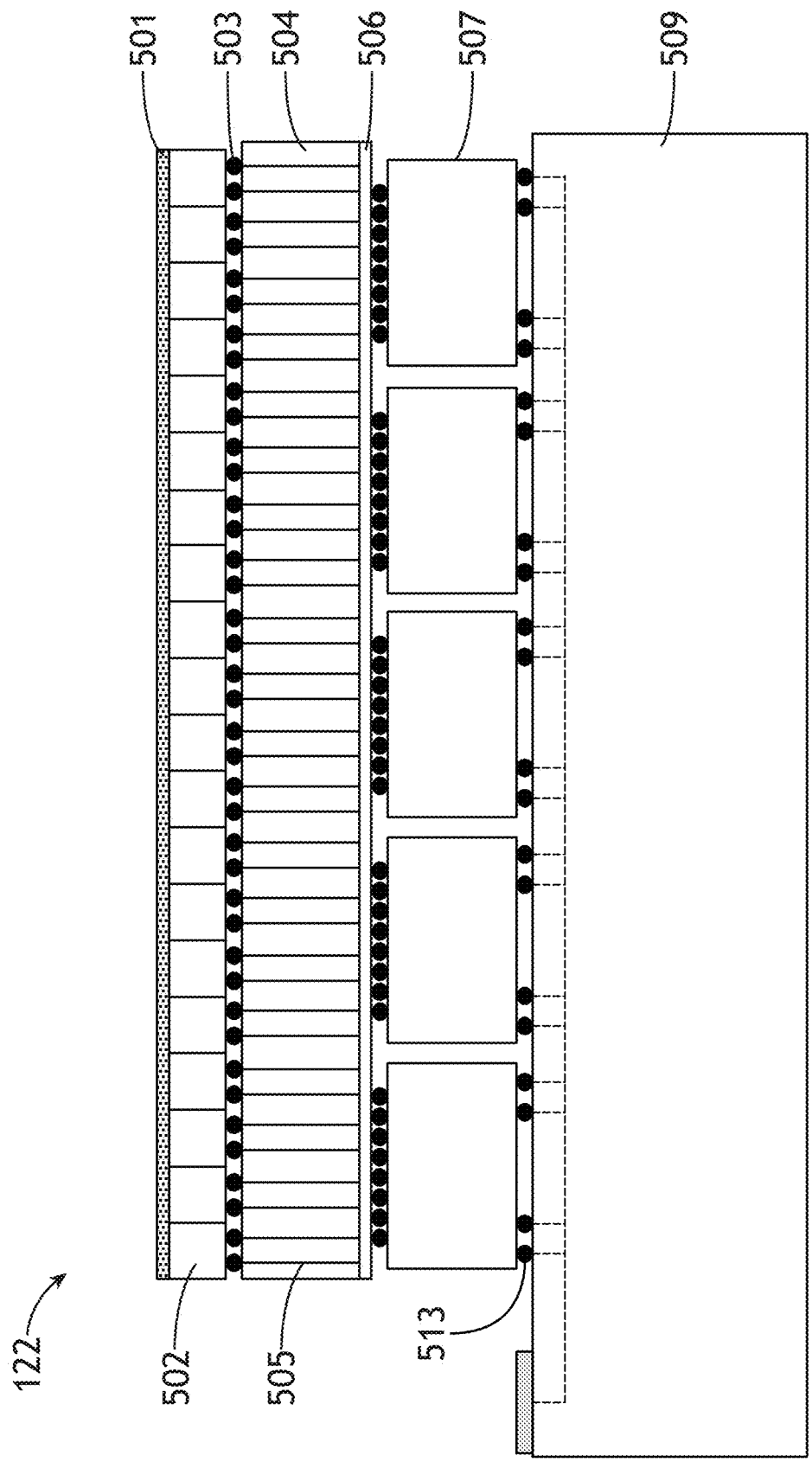

FIGS. 5A-5B illustrate the physical assembly of the detector module 122 respectively, in accordance with one or more embodiments of the present disclosure.

FIG. 5A depicts a backside view of one embodiment of a multipixel detector module 122, where several ASICs 507 are connected to the sensor. The view is onto the backside of the ASICs 507. FIG. 5B depicts a sideview of the detector module 122 including multipixel solid-state sensor 502 with a backside treatment 501. In embodiments, the backside treatment may 501 include a boron coating. In embodiments, the sensor layer is connected to a Through-Silicon-via-Interposer (TSI) 504 via solder bumps. Other assembly techniques, such as Direct-Bond-Interconnect (DBI) may be utilized. The TSI 504 (TSVs) of approximately 100 µm thickness may utilize fine pitch (10 µm-20 µm). Through Silicon-Vias 505 may electrically connect the front side of the TSI 504 with the backside. The pitch of the TSVs 505 in the TSI 504 may be much denser than the pixel pitch in the sensor 502 or ASIC 504. A multi-metal Re-Distribution-Layer (RDL) comprising multiple metal layers 506 (e.g., 4 or more) is used on the backside of the TSI 504 to route the different pixel outputs from the sensor to the inputs of the ASICs 507 that may be at different pitch. For example, a 250 µm×250 µm sized pixel on the sensor layer could be matched by a pixel of approximately 180 µm×180 µm size in the ASIC 507.

In embodiments, as shown in FIG. 5B, the ASIC 507 may embody TSVs 505 and the inputs and outputs of the ASIC 507 may be connected on the backside of the ASIC 507 to electrical connections on the mechanical substrate 509. In the case of a 16×16 pixel covered by each ASIC 507, the difference in pixel size between the ASIC 507 and sensor 502 may leave approximately 1 mm space between the ASICs 507 as an assembly margin.

Figure 5C:
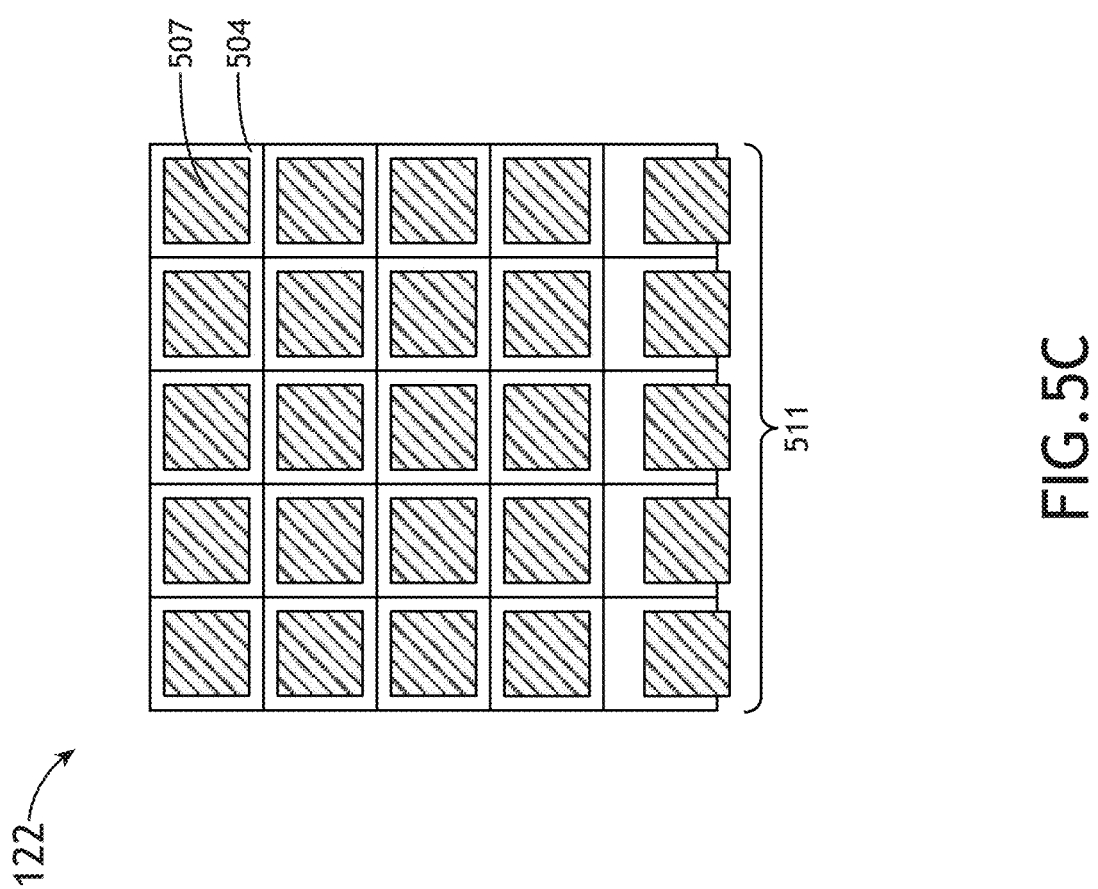
FIGS. 5C-5D illustrate the physical assembly of the detector module respectively, in accordance with one or more additional and/or alternative embodiments of the present disclosure.
Figure 5D:
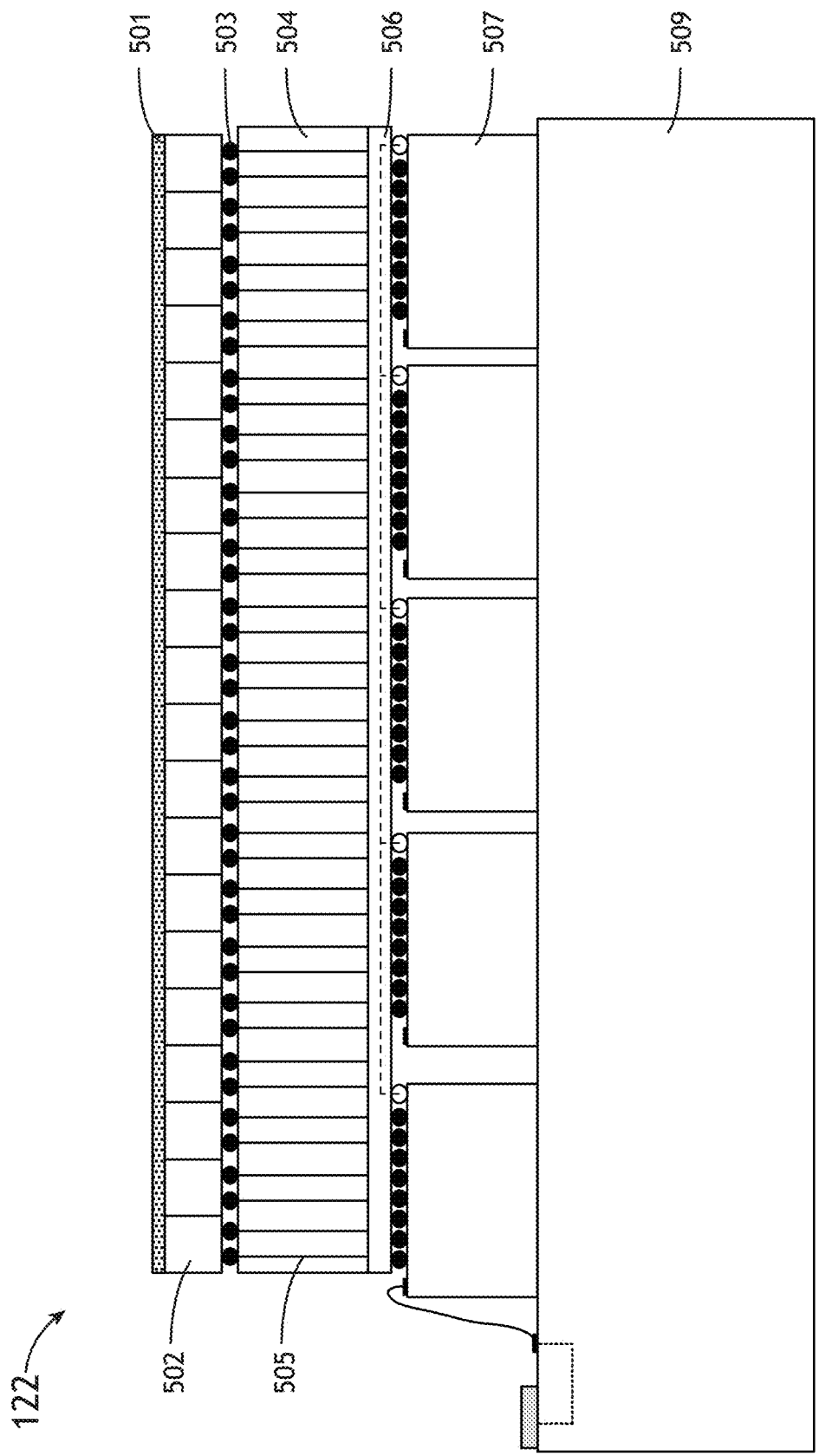

In embodiments, the ASIC 507 may not contain TSVs 505. In this case, as shown in FIGS. 5C and 5D, an alternative assembly may be implemented. In this embodiment, one row of ASICs 511 at the side of the senor is offset such that wire bond pads are exposed and accessible for connection to the substrate 509. The steering signal and the data transfer from one to other ASICs 507 that are under the sensor area may be accomplished via additional solder connections to the TSI 504 and are routed within the RDL of the TSI 504 to the other ASICs 507.

It is noted that, in embodiments where the detector module 122 utilizes one or more TSVs 505 in the ASIC 507, the construction of an indefinitely scalable detector module 122 without creating gaps within the sensitive area of the detector module 122 are possible.

The assembly depicted in FIG. 5D may be fabricated using the following procedure.

The TSI 504 may be fabricated to have a selected thickness (e.g., approximately 100 µm), the ASICs 507 may be thinned down to a selected thickness (e.g., approximately 100 µm), and an un-thinned sensor 502 may be provided. First, a handle wafer (not shown) may be attached to the frontside side (i.e., bottom side of sensor 502 as shown in FIG. 5D) of the sensor 502. Then, the backside of the sensor 502 may be thinned. Following thinning, the backside of the sensor 502 may be treated. For example, the backside of the sensor 502 may be treated with a boron implant process to form a boron implant layer 501. Then, a handle wafer (not shown) may be attached to the backside (i.e., top side of sensor 502 as shown in FIG. 5D) of the sensor 502. In turn, the handle wafer may be removed from frontside of the sensor 502. Then, the frontside of sensor 502 may be electrically connected via one or more connection mechanisms 503 to the front side of the TSI 504 (e.g., with solder bump or direct bond (DBI) techniques). In addition, the ASICs 507 may be electrically connected to the backside of the TSI 504 with the redistribution layer 506. Finally, the handle wafer may be removed from backside of sensor 502 and the sensor/TSI/ASIC assembly may be attached to a substrate 509. The handle wafer may be removed after the sensor/TSI/ASIC assembly is attached to the substrate 509.

It is noted that the procedure for fabricating the assembly depicted in FIG. 5B may take on a similar method to the procedure for the assembly depicted in FIG. 5D. In addition, the fabrication of the assembly of FIG. 5B may include ASICs 507 with TSVs 505 (Through-Silicon-Vias) and an additional step whereby a handle wafer is used to thin and mount the ASICs 507 to the substrate 509 and electrically connect the pads with solder bumps 513.

Figure 6A:
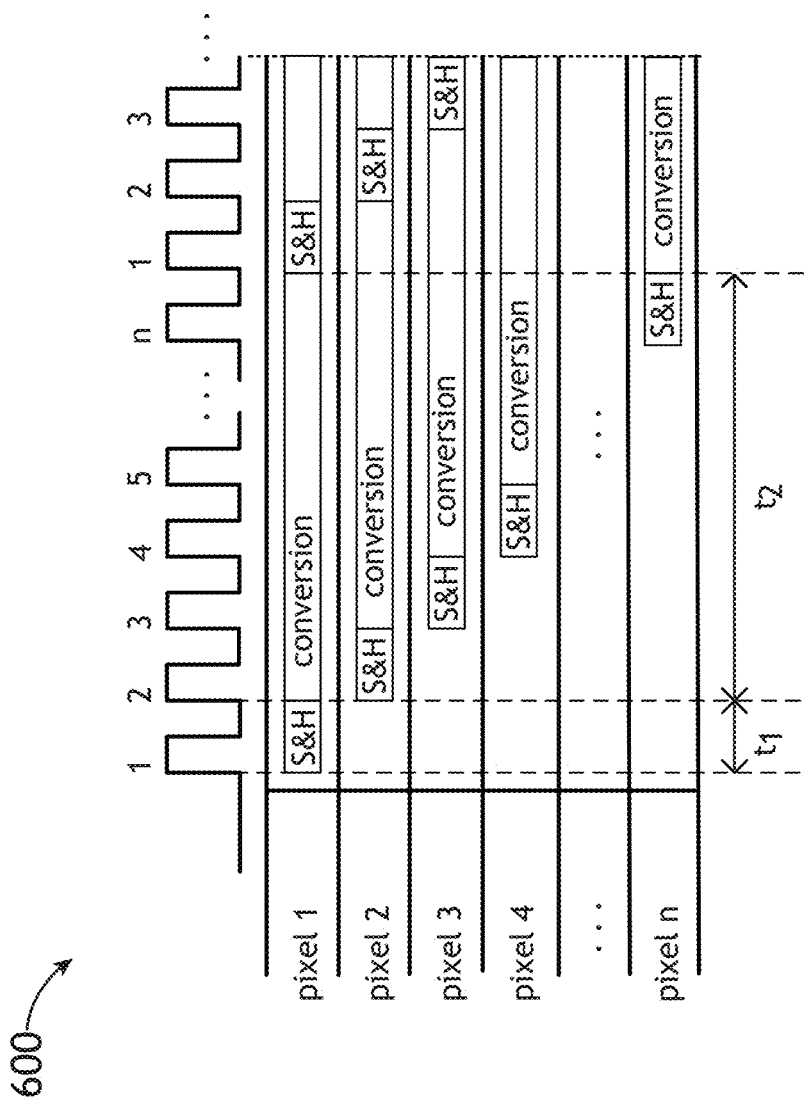
FIG. 6A illustrates a conceptual view of the timing of the distributed digitization scheme using several ADCs within the ASIC to process the clusters, in accordance with one or more embodiments of the present disclosure.
Figure 6B:
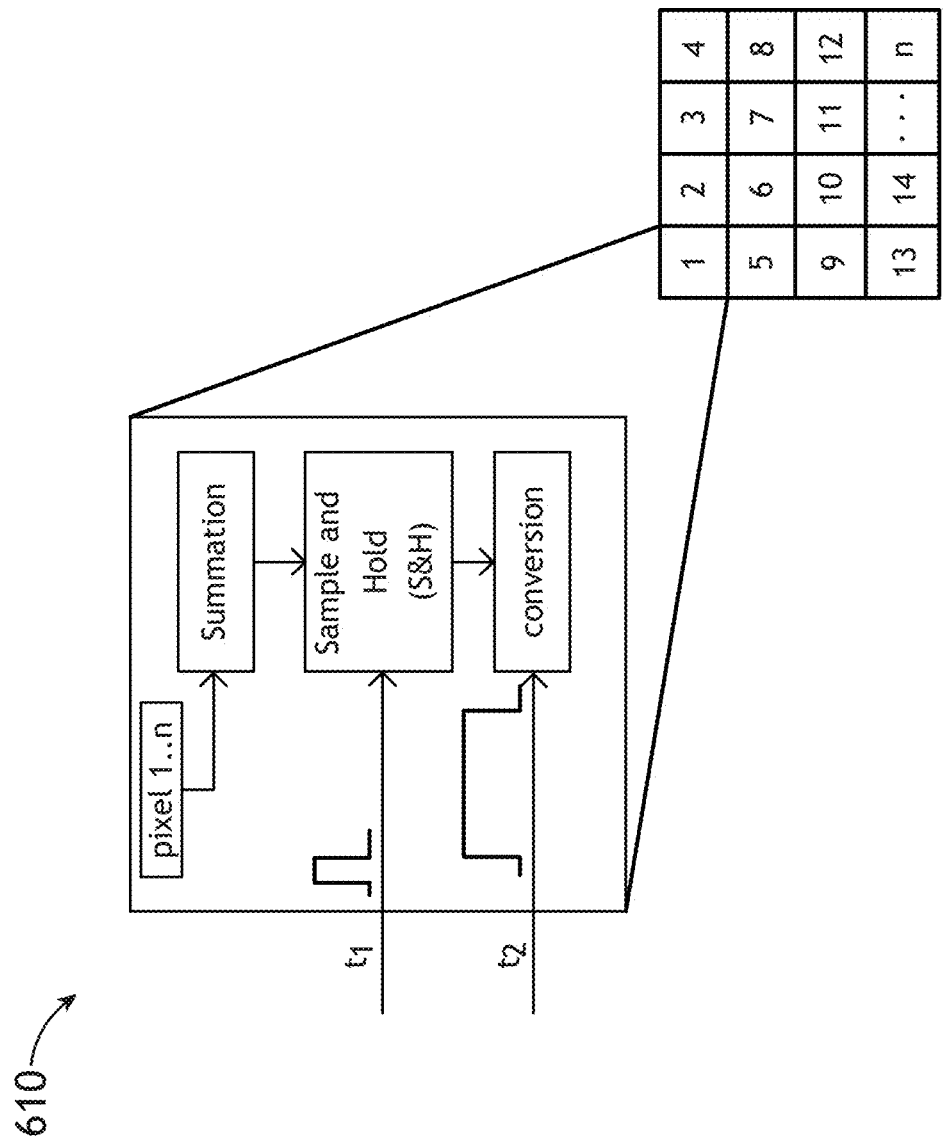
FIG. 6B illustrates a conceptual view of the application of a sample and hold circuit to a signal form one or more pixels and the subsequent analog-to-digital conversion of the signal, in accordance with one or more embodiments of the disclosure.

FIG. 6A illustrates a conceptual view 600 of the timing of the distributed digitization scheme using several ADCs within the ASIC to process the clusters, in accordance with one or more embodiments of the present disclosure. It is noted that the distributed digitation scheme may employ any number of ADCs, such as, but not limited to, 256. FIG. 6B depicts a conceptual view 610 of a sample and hold (S&H) circuit to a signal form one or more pixels and the subsequent analog-to-digital conversion of the signal. As shown in FIG. 6B, each digitizer may employ a fast S&H circuit that can hold the analog value at the speed of the sample scan clock t1, at which the electron beam is rastering across the sample. Each ADC may then convert the analog value to a digital value within the conversion time t2, which is significantly slower than t1. The conversion time t2 is compatible with the number of sample scans and the number of pixels (hence ADC) that are combined to a cluster. In one example, 8×8 pixel of the sensor might be combined into one cluster and 64 ADCs are used for the conversion of this cluster. In this example, a single conversion frequency of 3 MHz may then support a wafer scan clock of 192 MHz.

Figure 7:
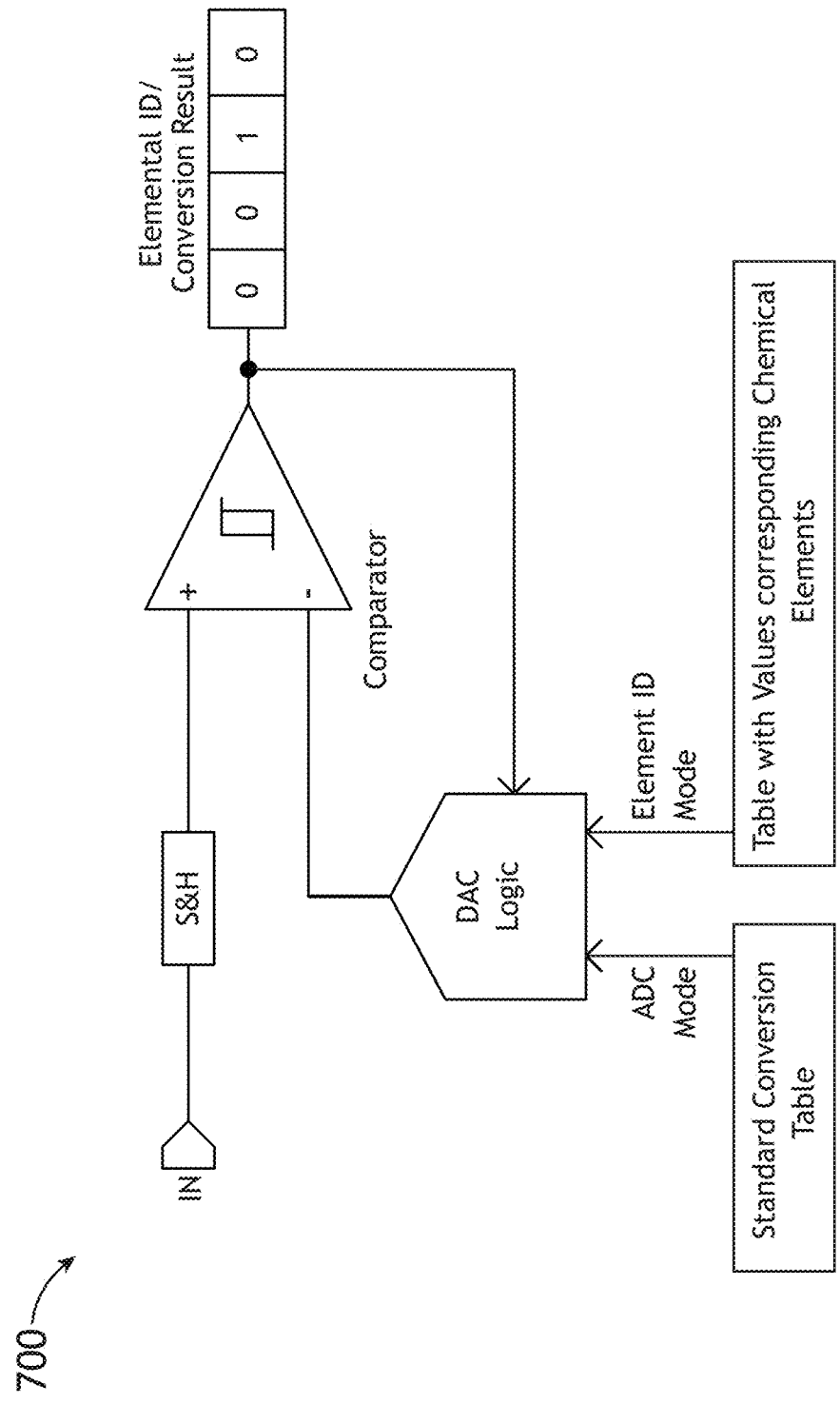
FIG. 7 illustrates a block diagram view of an analog-to-digital conversion (ADC) unit implemented within a pixel of the readout ASIC, in accordance with one or more embodiments of the present disclosure.

FIG. 7 illustrates the analog-to-digital conversion (ADC) unit 700 within each pixel of the readout ASIC, in accordance with one or more embodiments of the present disclosure. In embodiments, an initial S&H unit stores an acquired signal from the detector for each clock cycle of a sample scan. The ADC 700 may then be used in a classical analog-to-digital conversion following a SAR (Successive-Approximation-Register) ADC principle. In 'ADC mode,' the DAC (Digital-to-Analog-Converter) is supplied by a look-up table (LUT), which is a standard conversion table, that contains standard conversion steps from a binary search that results in equidistant digitization.

In embodiments, the DAC may also be driven by a look-up-table (LUT) that contains reference levels equivalent to upper and lower thresholds values (defining energy windows) of chemical elements that may be present during the sample scan, such as silicon, aluminum, copper, titanium and others. The result of the comparison of each signal with the energy window yields the presence of a particular chemical element. This mode may be called 'Element ID Mode.' In embodiments, the ADC unit 700 may switch between ADC mode and Element ID mode. It is noted that switching between ADC mode and Element ID mode may only require different configuration of the look-up-table that is used in the ADC unit 700. The ADC 700 unit may contain multiple comparators, one for the upper thresholds and one for the lower thresholds defining energy windows for each specific element to be detected.

Figure 8:
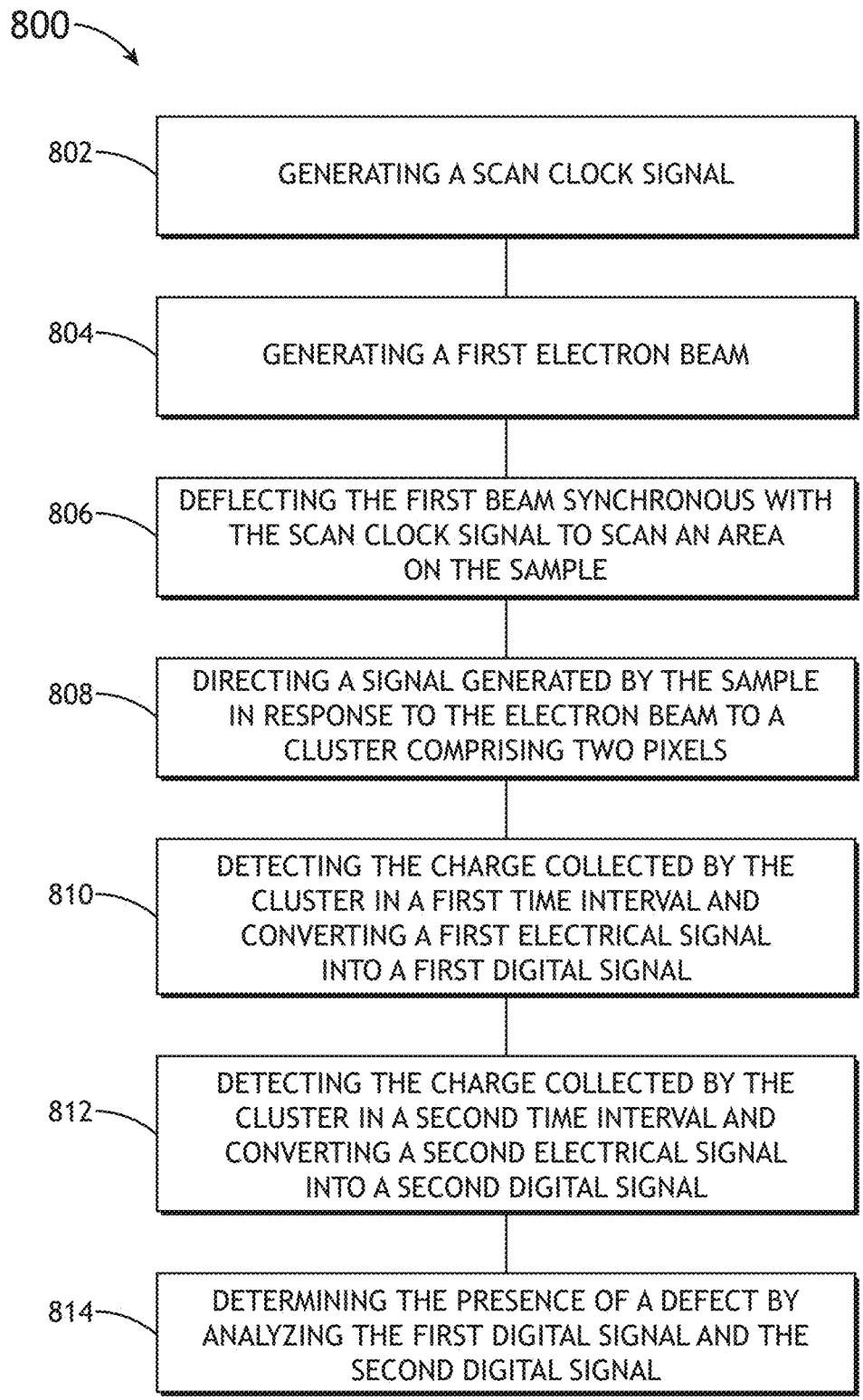
FIG. 8 illustrates a flowchart depicting a method of inspecting a sample, in accordance with one or more embodiments of the present disclosure.

FIG. 8 illustrates a flowchart of a method 800 for inspecting a sample, in accordance with one or more embodiments of the present disclosure. It is noted herein that the steps of method 800 may be implemented all or in part by system 100. It is further recognized, however, that the method 800 is not limited to the system 100 in that additional or alternative system-level embodiments may carry out all or part of the steps of method 800.

In step 802, the method 800 includes generating a scan clock signal. In step 804, the method 800 includes generating a first electron beam. In step 806, the method includes deflecting the first electron beam synchronous with the scan clock signal to scan an area on the sample. In step 808, the method 800 includes directing a signal generated by the sample in response to the electron beam to a cluster comprising two or more pixels. In step 810, the method 800 includes detecting charge collected by the cluster in a first time interval, wherein the first time interval is synchronized to the scan clock to generate a first electrical signal corresponding to the charge collected by the cluster in the first time interval and converting the first electrical signal into a first digital signal. In step 812, the method includes detecting the charge collected by the cluster in a second time interval, wherein the second time interval is synchronized to the scan clock to generate a second electrical signal corresponding to the charge collected in the second time interval and converting the second electrical signal into a second digital signal, wherein converting the second electrical signal starts before converting the first electrical signal is completed. In step 814, the method 800 includes determining the presence of a defect by analyzing the first digital signal and the second digital signal.

Figure 9:
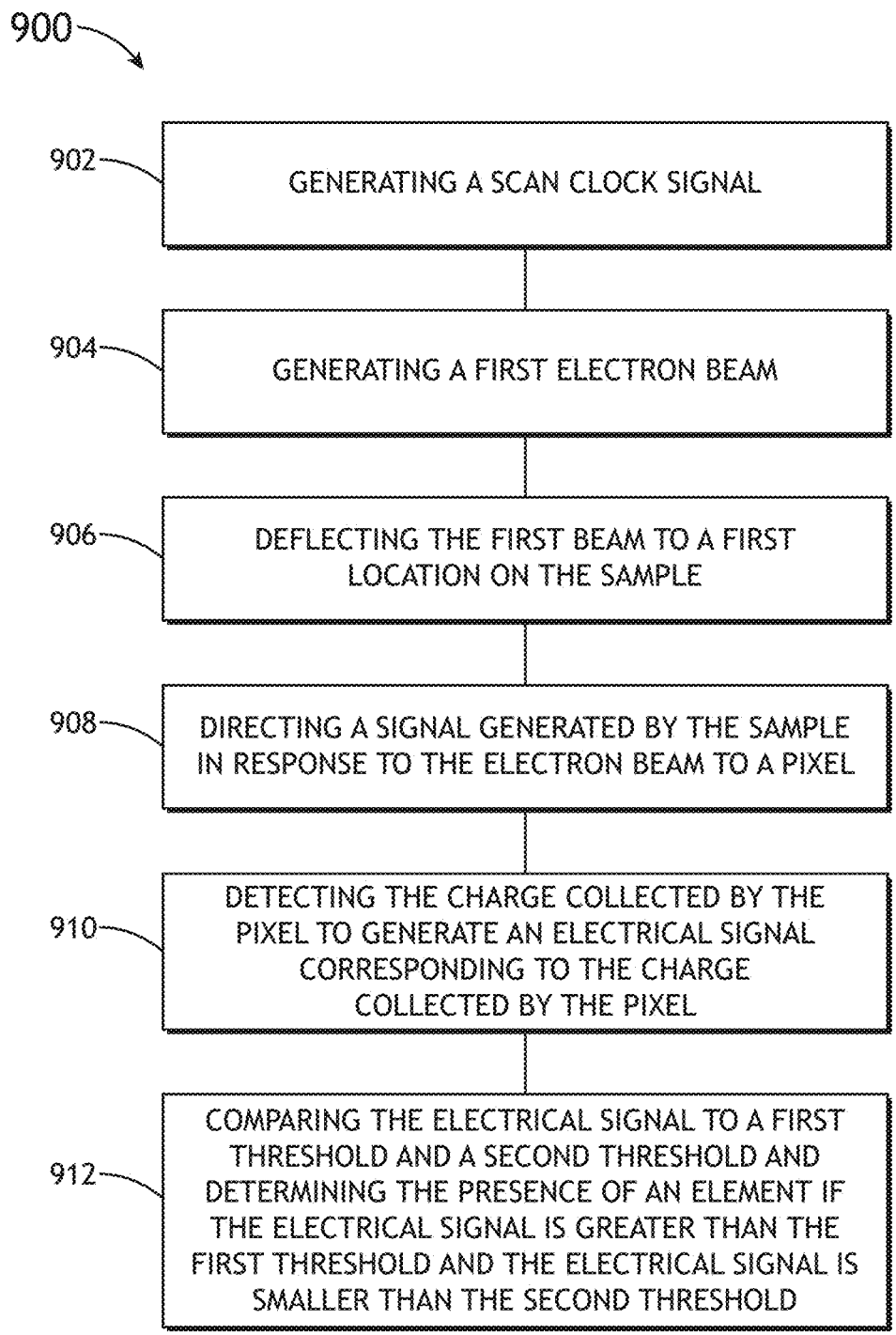
FIG. 9 illustrates a flowchart depicting a method of inspecting a sample, in accordance with one or more additional and/or alternative embodiments of the present disclosure

FIG. 9 illustrates a flowchart of a method 900 for inspecting a sample, in accordance with one or more additional and/or alternative embodiments of the present disclosure. It is noted herein that the steps of method 900 may be implemented all or in part by system 100. It is further recognized, however, that the method 900 is not limited to the system 100 in that additional or alternative system-level embodiments may carry out all or part of the steps of method 900.

In step 902, the method 900 includes generating a scan clock signal. In step 904, the method 900 includes generating a first electron beam. In step 906, the method 900 includes deflecting the first electron beam to a first location on the sample. In step 908, the method 900 includes directing a signal generated by the sample in response to the first electron beam to a pixel. In step 910, the method 900 includes detecting the charge collected by the pixel to generate an electrical signal corresponding to the charge collected by the pixel. In step 912, the method includes comparing the electrical signal with a first threshold and a second threshold and determining the presence of an element if the electrical signal is greater than the first threshold and the electrical signal is smaller than the second threshold.

Referring again to FIG. 1, in embodiments, the system 100 includes a controller 140. The controller 140 may be used to provide one or more control signals C to the electron source 102, electron optical column 111, and/or the detector assemblies 122a-122c. In this regard, the controller 140 may control any aspect of the SEM system 100. In embodiments, the controller 140 may receive one or more image data signals ID1, ID2 from the detector assemblies 122a-122c indicative of or containing one or more features of the sample 128 (e.g., defects, pattern features, metrology targets, and the like). The controller 140 may include one or more processors configured to execute program instructions maintained in a memory medium. In this regard, the one or more processors of controller 140 may execute any of the various process steps described throughout the present disclosure.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A scanning electron microscopy system comprising:
   an electron source configured to generate an electron beam;
   a set of electron optics configured to scan the electron beam across a sample and focus electrons scattered by the sample onto one or more imaging planes; and
   a first detector module positioned at the one or more imaging planes,
   wherein the first detector module includes a multipixel solid-state sensor configured to convert scattered particles from the sample into a set of equivalent signal charges,
   wherein the multipixel solid-state sensor is connected to two or more Application Specific Integrated Circuits (ASICs) configured to process the set of signal charges from one or more pixels of the sensor, wherein each ASIC includes a plurality of clusters, wherein each cluster includes at least four pixels, wherein a respective ASIC is configured to:
   detect a charge collected by a respective cluster in a first time interval, wherein the first time interval is synchronized to a scan clock to generate a first electrical signal corresponding to the charge collected by the respective cluster in the first time interval, and convert the first electrical signal into a first digital signal; and
   detect a charge collected by the respective cluster in a second time interval, wherein the second time interval is synchronized to the scan clock to generate a second electrical signal corresponding to the charge collected in the second time interval, and convert the second electrical signal into a second digital signal, wherein converting the second electrical signal starts before converting the first electrical signal is completed.

2. The scanning electron microscopy system of claim 1, wherein a respective pixel of the multipixel solid-state sensor comprises a floating diffusion capacitive node to collect the equivalent signal charges and generate an equivalent voltage, a reset stage to control the voltage of the floating diffusion node, and an amplifier to drive the voltage at the floating diffusion node to an input of the two or more ASICs.

3. The scanning electron microscopy system of claim 2, wherein the respective pixel of the multipixel solid-state sensor of the first detector module comprises a second contact connected to the reset stage of the respective pixel and controlled by the two or more ASICs.

4. The scanning electron microscopy system of claim 1, wherein the electron source comprises a multi-beam electron source configured to generate a second electron beam, wherein the set of electron optics is further configured to scan the second beam across the sample.

5. The scanning electron microscopy system of claim 4, wherein the set of electron optics are further configured to focus electrons scattered by the sample from the first beam to a first pixel of the multipixel sensor, and to focus electrons second scattered by the sample from the second beam to a second pixel of the multi-pixel solid-state sensor.

6. The scanning electron microscopy system of claim 1, wherein the first detector module includes a multipixel solid-state sensor layer and an ASIC layer fabricated on different wafers and directly connected by at least one of microsolder bumps or direct bond interface connections of 100-200 µm pitch, wherein one or more ASICs are attached to a substrate and at least one of inputs or outputs of the one or more ASICs are connected to electrical traces on the substrate by wire bonds.

7. The scanning electron microscopy system of claim 1, wherein the multipixel solid-state sensor and the two or more ASICs are connected via a Through-Silicon-Interposer (TSI).

8. The scanning electron microscopy system of claim 1, wherein the two or more ASICs further comprise Through- Silicon-Vias (TSV) to connect one or more inputs and one or more outputs of the two or more ASICs to traces on a substrate.

9. The scanning electron microscopy system of claim 1, further comprising: at least a second detector module substantially coplanar to the first detector module, wherein the first detector module and the at least the second detector module are configured to form an aperture for the electron beam, and the set of electron optics are configured such that the electron beam passes through the aperture.

10. The scanning electron microscopy system of claim 1, wherein at least one of the two or more ASICs comprises a Look-Up-Table (LUT) configured to store a first threshold and a second threshold, and a comparator configured to compare signal charges to the first threshold and to the second threshold, wherein the comparator is configured to generate results indicative of whether each signal charge is within the first threshold and the second threshold.

11. The scanning electron microscopy system of claim 1, wherein the first detector module comprises one or more screens, wherein the one or more screens are formed from at least one of beryllium, carbon, boron, magnesium, or aluminum.

12. The scanning electron microscopy system of claim 1, wherein the first detector module is configured to detect backscattered electrons from the sample.

13. The scanning electron microscopy system of claim 1, wherein the first detector module is configured to detect secondary electrons from the sample.

14. The scanning electron microscopy system of claim 1, wherein the first detector module is configured to detect x-rays from the sample.

15. A scanning electron microscopy system comprising:
an electron source configured to generate an electron beam;
a set of electron optics configured to scan the electron beam across a sample and focus electrons scattered by the sample onto one or more imaging planes; and
a first detector module positioned at the one or more imaging planes,
wherein the first detector module includes one or more multipixel Application Specific Integrated Circuits (ASICs), wherein each pixel of the one or more multipixel ASICs comprises a photodiode configured to convert particles scattered by the sample into equivalent electrical signals, and each pixel of the one or more multipixel ASICs includes circuitry to process the equivalent electrical signals, wherein each multipixel ASIC includes a plurality of clusters, wherein each cluster includes at least four pixels, wherein a respective ASIC is configured to:
detect charge collected by a respective cluster in a first time interval, wherein the first time interval is synchronized to a scan clock to generate a first electrical signal corresponding to the charge collected by the respective cluster in the first time interval, and convert the first electrical signal into a first digital signal; and
detect a charge collected by the respective cluster in a second time interval, wherein the second time interval is synchronized to the scan clock to generate a second electrical signal corresponding to the charge collected in the second time interval, and convert the second electrical signal into a second digital signal, wherein converting the second electrical signal starts before converting the first electrical signal is completed.

16. The scanning electron microscopy system of claim 15, wherein the electron source comprises a multi-beam electron source configured to generate a second electron beam, wherein the set of electron optics is further configured to scan the second beam across the sample.

17. The scanning electron microscopy system of claim 16, wherein the set of electron optics are further configured to focus electrons scattered by the sample from the first beam to a first pixel, and to focus electrons second scattered by the sample from the second beam to a second pixel.

18. The scanning electron microscopy system of claim 15, wherein the multipixel Application Specific Integrated Circuit (ASIC) further comprises Through-Silicon-Vias (TSVs) to connect one or more inputs and one or more outputs of the multipixel Application Specific Integrated Circuit (ASIC) to traces on a substrate.

19. The scanning electron microscopy system of claim 15, further comprising: at least a second detector module substantially coplanar to the first detector module, wherein the first detector module and the at least the second detector module are configured to form an aperture for the electron beam and the set of electron optics are configured such that the electron beam passes through the aperture.

20. The scanning electron microscopy system of claim 15, wherein the ASIC comprises a Look-Up-Table (LUT) configured to store a first threshold and a second threshold, and a comparator configured to compare signal charges to the first threshold and to the second threshold, wherein the comparator is configured to generate results indicative of whether each signal charge is within the first threshold and the second threshold.

21. The scanning electron microscopy system of claim 15, wherein the first detector module comprises one or more screens, wherein the one or more screens are formed from at least one of beryllium, carbon, boron, magnesium, or aluminum.

22. The scanning electron microscopy system of claim 15, wherein the first detector module is configured to detect backscattered electrons from the sample.

23. The scanning electron microscopy system of claim 15, wherein the first detector module is configured to detect secondary electrons from the sample.

24. The scanning electron microscopy system of claim 15, wherein the first detector module is configured to detect x-rays from the sample.

* * * * *